(12) United States Patent
Miida

(10) Patent No.: US 6,512,547 B1
(45) Date of Patent: Jan. 28, 2003

(54) SOLID-STATE IMAGING DEVICE AND METHOD OF DETECTING OPTICAL SIGNALS USING THE SAME

(75) Inventor: Takashi Miida, Kanagawa (JP)

(73) Assignee: Innovision, Inc. (JP)

(*) Notice: Subject to any disclaimer, the term of this patent is extended or adjusted under 35 U.S.C. 154(b) by 0 days.

(21) Appl. No.: 09/441,667

(22) Filed: Nov. 17, 1999

Related U.S. Application Data

(62) Division of application No. 09/192,529, filed on Nov. 17, 1998, now Pat. No. 6,051,857.

(30) Foreign Application Priority Data

Jan. 7, 1998 (JP) .......................................... 10-186453

(51) Int. Cl.[7] ................................................ H04N 3/14
(52) U.S. Cl. ...................... 348/310; 348/300; 257/292; 250/208.1
(58) Field of Search ................................ 348/241, 248, 348/249, 250, 294, 300–304, 307–311, 315; 257/212, 222, 223, 229, 230, 232, 233, 290, 291, 292; 250/208.1, 370.01, 370.14; H04N 3/14

(56) References Cited

U.S. PATENT DOCUMENTS

| | | | |
|---|---|---|---|
| 4,901,129 A | 2/1990 | Hynecek ..................... 257/223 |
| 5,068,736 A | * 11/1991 | Hamasaki ................... 348/296 |
| 5,355,013 A | * 10/1994 | Parker ........................ 257/292 |
| 5,789,774 A | 8/1998 | Merrill ....................... 257/292 |
| 5,808,333 A | * 9/1998 | Maruyama ................... 257/290 |
| 5,841,176 A | 11/1998 | Merrill ....................... 257/446 |
| 5,869,352 A | 2/1999 | Maruyama et al. ............ 438/79 |
| 5,872,371 A | 2/1999 | Gudash et al. ............... 257/230 |
| 5,970,316 A | 10/1999 | Merrill ........................ 438/57 |
| 6,218,656 B1 | * 4/2001 | Guidash ..................... 257/299 |

FOREIGN PATENT DOCUMENTS

| | | | |
|---|---|---|---|
| EP | 082367411 | 12/1995 | ......... H01L/27/146 |
| EP | 0809299 | 11/1997 | ......... H01L/27/146 |
| EP | 0809299 | 9/1998 | ......... H01L/27/146 |
| JP | 60-140752 | 7/1985 | ........... H01L/27/14 |
| JP | 60-206063 | 10/1985 | ........... H01L/27/14 |
| JP | 64-14959 | 1/1989 | ........... H01L/27/14 |
| JP | 02-304973 | 12/1990 | ......... H01L/27/146 |
| JP | 06-120473 | 4/1994 | ......... H01L/27/146 |

OTHER PUBLICATIONS

1996 IEEE International Solid–State Circuits Conference p. 180–181; 440.

* cited by examiner

*Primary Examiner*—Ngoc-Yen Vu
(74) *Attorney, Agent, or Firm*—Lorusso & Loud

(57) ABSTRACT

The present invention is a method for detecting photo signals using an imaging device, comprising steps of photo-generating holes in a well region 15 of a photo-diode by a signal light, transferring the photo-generated holes through a bulk of the well region 15 to a heavily doped buried layer 25 which is formed in the well region 15 near a source region 16 by doping that region with impurity heavier than the well region (15) of an insulated gate FET, storing the photo-generated holes in the heavily doped buried layer 25 to thereby change the threshold of the FET corresponding to the amount of the photo-generated charge, and reading the change in the threshold as the amount of signal light received by the photo-sensor.

4 Claims, 13 Drawing Sheets

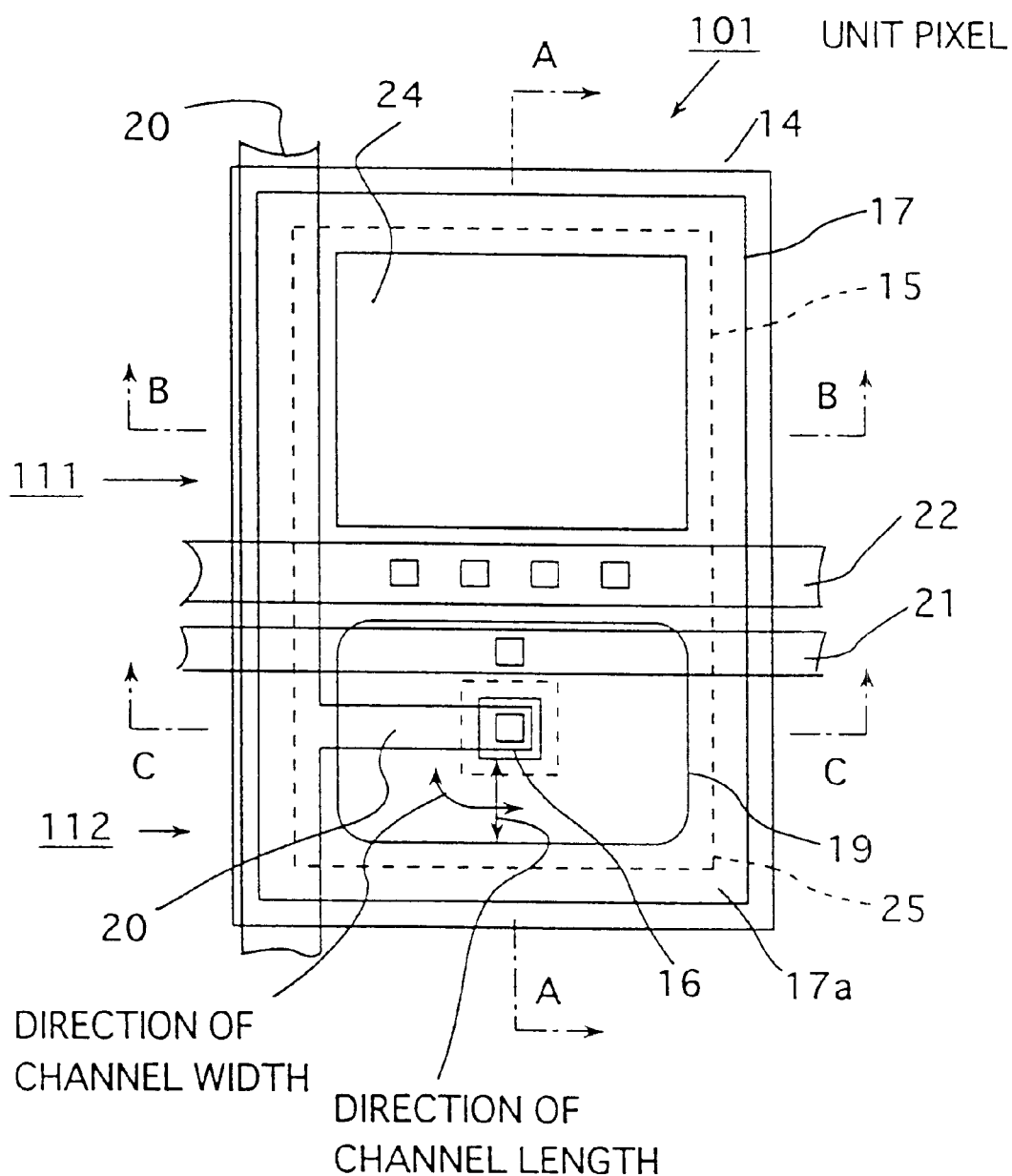

FIG. 3
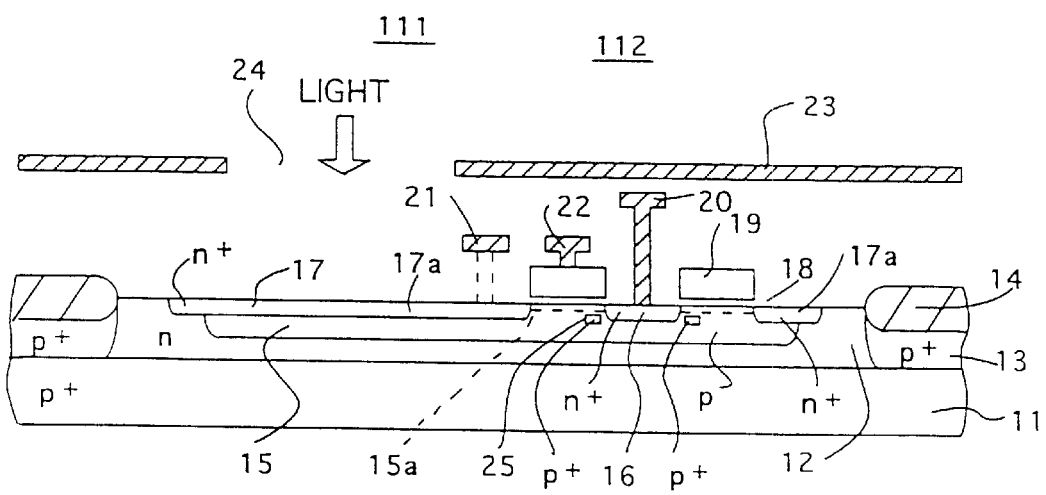
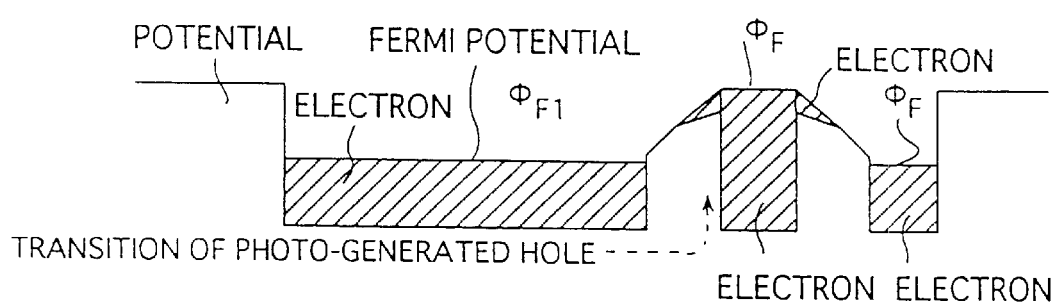

SURFACE POTENTIAL (AFTER INITIALIZATION)
PRESENT INVENTION

SURFACE POTENTIAL (SHIELDED FROM LIGHT)
PRESENT INVENTION

SURFACE POTENTIAL (AT RECEPTION OF LIGHT)
PRIOR ART (PHOTO-GATE TYPE)

SOLID-STATE IMAGING DEVICE AND METHOD OF DETECTING OPTICAL SIGNALS USING THE SAME

This application is a division of U.S. Ser. No. 09/192,529, filed Nov. 17, 1998, U.S. Pat. No. 6,051,857.

BACKGROUND OF THE INVENTION

1. Field of the Invention

The invention relates to a threshold modulation MOS type solid-state imaging device for use in video cameras, electronic cameras, image input cameras, scanners, and facsimiles, and to a method of detecting optical signals using such solid-state imaging device.

2. Description of the Prior Art

Semiconductor image sensors have been widely used in most image input devices because they can be mass produced using advanced fine patterning techniques. In particular, charge coupled devices (hereinafter referred to as CCDs) are used in various kinds of imaging apparatuses such as video cameras and facsimiles since they have high photo-sensitivity and low noise levels.

However, it is known that CCDs have the drawbacks, such that (1) they require a large power consumption and an high operating voltage;

(2) they require a rather complicated manufacturing process and are costly as compared with CMOS type devices; and (3) unlike CMOS devices, they cannot easily incorporate therein a complex peripheral circuit therefor.

On account of these impediments of CCDs to be solved, and because of a recent spread of a need for solid-state imaging devices in the marketplace, MOS type solid-state imaging devices have gained a great deal of attention. In addition, recent advancement of sub-micron CMOS technologies have proved feasibility of the fabrication of sub-micron imaging devices.

It should be noted, however, that conventional MOS type image sensors are inferior to CCD image sensors in performance. For example, MOS type image sensors suffer from random noise and fixed pattern noise. Thus, these principal problems must be overcome in order for MOS type image sensors to be useful.

On the other hand, micro-lens technology has enabled to scale down a photo-sensitive area. Several fine fabrication technologies (micro-technologies) have enabled to construct an integrated transistor amplifier involving two or three transistors for each pixel to result in enhancing the sensitivity of a MOS device. Thus, by the use of such an integrated circuit technology, it is now possible to reduce thermal noise (kTC noise) generating in X or Y MOS switches and fixed pattern noise due to structural non-uniformity of the device elements.

Therefore, a type of active CMOS image sensors, which are equipped with a transistor amplifier fabricated in each pixel of photo-detection portion using a micro-technology, has attracted much attention.

Active CMOS image sensors require no special technology. That is, they enable to easily integrate by ordinary CMOS technology peripheral CMOS circuits and the light sensing element on the single chip, so that they can be manufactured at low cost. In addition, they have advantages that they operate at a low operating voltage and consumes less power.

Thus, active CMOS image sensors are anticipated in near future to play an important role in one-chip cameras equipped with a sophisticated signal processing circuit.

Developments of prior art active CMOS image sensor are discussed in the following references.

(1) Japanese Patent Early Publications Nos. 60-140752, 60-206063, and 6-120473 disclose charge modulation devices (CMDs). A CMD uses a photo-sensitive area converter, which has CCD-like features. The gate electrode of the MOS transistor has a photo-gate electrode structure to improve its fill factor which is a ratio of a light transmitting area to a total area consisting of the light transmitting area and a light shielding area. This device is adapted to control a current passing through the MOS transistor by storing photo-generated charges in a surface of a Si layer below the photo-gate electrode of the MOS transistor.

(2) Japanese Patent Early Publication No. 64-149959 discloses a bulk charge modulated device (BCMD) as shown in FIG. 1. In this device also, in order to improve the fill factor, the gate electrode 7 of the MOS transistor has a photo-gate electrode structure and incorporates a layer (hereinafter referred to as a charge storing layer) for storing photo-generated charges. The charge storing layer is formed in a p-type well layer 3 on an n-type layer 2 and below the photo-gate electrode 7 as shown in FIG. 1A. It is noted that in this example the charge storing layer is formed in the p-type well layer 3 below the channel region 9 so as to suppress trapping of the photo-generated charges to surface trap levels in an interface portion between the n-type layer 9 and a gate oxide film 6 in contact with the layer 9. As a result, the noise caused by the photo-generated charges trapped in the surface trap levels may be suppressed. The MOS transistor shown in FIG. 1A also includes a p+-type substrate 1 on which the n-type layer 2 is formed, a source diffusion region 4 and a drain diffusion region 5 which are formed in the p-type well layer 3 at the both sides of the gate electrode 7, and a constant-current source 8.

(3) Japanese Patent Early Publication, No. 2-304973 disclosed a threshold voltage modulation type solid-state imaging device which has a ring-shaped gate electrode structure, in which a source diffusion region is formed at the center part surrounded by the ring-shaped gate electrode, and a drain diffusion region is formed so as to surround the source diffusion region and the ring-shaped gate electrode. The drain diffusion region is also extended to the light-detection portion and it serves as a heavily doped buried layer for a buried photo-diode. This example is characterized in that a photo-sensing device is provided outside the transistor and that a potentially minimum region is provided for signal charges, which lies within a well region below the channel region and extends along the entire length of the channel region, but occupies only a part of the entire channel width.

In this solid-state imaging device, the photo-generated charges, that is, electron-hole pairs occur in the buried photo-diode by illuminating it with light, and the charges of one-type of these pairs are stored in the photo-diode and results in a substrate bias or a change in potential of the substrate. The bias is used in controlling the threshold voltage of the MOS transistor. This imaging device is useful especially when the intensity of light is weak wherein only a small amount of charges are generated by light. The photo-generated charges are collected at the potentially minimum region to suppress the non-uniformity in sensitivity of the imaging device and to suppress associated fixed pattern noise.

However, a problem of random noise still remains in CMD type solid-state imaging devices. The random noise is caused by the trapping or scattering of the photo-generated charges in the surface region of the semiconductor, which cannot be removed completely by the above mentioned modifications, since a photoelectric conversion is done in the CMD solid-state imaging device using charges near the surface of the semiconductor.

The BCMD type solid-state imaging device as shown in FIG. 1A is used in a source follower connection. In this case, since the charge storing layer 3 lies in the entire channel region underlying the photo-gate electrode 7, it is difficult to drive the transistor under a sufficiently saturated condition. Consequently, the transistor operates in a triode-region current-voltage characteristic shown in FIG. 1B, and thus the BCMD imaging device poses a problem that the photo-generated charges cannot be converted linearly to voltage by the source follower connection to the MOS transistor.

It is noted that, since the carriers in the charge storing layer 3 are distributed throughout the channel region under the photo-gate electrode 7 and since the channel region, as a whole, contributes to a modulation of a current through it, the potential variation is not a linear function of photo-generated charges. Besides, since the resultant capacitance based on the gate oxide film above the charge storing layer 3 is relatively large, so that its conversion efficiency is rather low.

Further, both of the CMD type and the BCMD type solid-state imaging devices each having a photo-gate structure suffer from degradation of spectral sensitivity to light caused by multiple interference of incident light, which is pertinent to a photo-sensing device having a MOS structure.

The photo-gate electrode structure presents a further problem that it needs a special, complex process in forming a thin transparent photo-gate electrode.

In a solid-state imaging device having a region of minimum potential formed within a well region and extending partially along the width of the channel region and along the entire length of the channel region, the transistor assumes the triode-like current-voltage characteristic, which is not adequate for a linear charge-voltage conversion of the photo-generated charges by a source follower connection to the MOS transistor.

SUMMARY OF THE INVENTION

It is an object of the invention to provide a solid-state imaging device which has little noise caused by the trapping and scattering of photo-generated carriers in the semiconductor surface of the device.

It is another object of the invention to provide a solid-state imaging device with an improved spectral sensitivity to light.

It is still another object of the invention to provide a solid-state imaging device having a linear charge-voltage conversion characteristic for a photo-generated charge.

It is a further object of the invention to provide a solid-state imaging device having therein a photo-sensing device that can be fabricated by an ordinary CMOS process.

It is a still further object of the invention to provide a light detection method using such a solid-state imaging device as described above.

In a constitution of the present invention, a solid-state imaging device equipped with a plurality of unit pixels each including a photo-diode and an insulated gate field effect transistor, said photo-diode comprising a substrate having a first conductivity type, a semiconductor layer formed on said substrate and having a second conductivity type, a well region formed on said semiconductor layer and having the first conductivity type, an impurity region formed on the surface of said well region and having the second conductivity type, and said insulated gate field effect transistor comprises a drain region formed on the surface of said well region, extending to said impurity region, and having the second conductivity type, a source region formed on the surface of said well region, spaced apart from said drain region, and having the second conductivity type, a gate electrode formed on a gate insulation layer which is formed on said well region and between said drain region and said source region; and a heavily doped buried layer formed in said well region near said source region below said gate electrode, said heavily doped buried layer doped with an impurity of the first conductivity type heavier in concentration than said well region.

The heavily doped region as the carrier pocket is separated from the drain region for injected carriers to contribute the efficient threshold voltage of MOS transistor modulation.

When a ring shaped gate electrode is used for example, the source diffusion region is formed in the surface layer of a well region in a central region surrounded by the ring-shaped gate electrode, and the drain diffusion region is formed in the surface layer of the well region surrounding the ring-shaped gate electrode, and the heavily doped buried layer is formed in the well region below the gate electrode so as to surround the source diffusion region.

In this arrangement, the heavily doped buried layer has a lowest potential for holes throughout the well region if the heavily doped buried layer of p-type is formed in a p-type well region. On the other hand, the heavily doped buried layer has a highest potential for electrons throughout the well region if the heavily doped buried layer of n-type is formed in an n-type well region.

The impurity diffusion region of the photo-diode is combining with the drain diffusion region of the field effect transistor (FET), so that the photo-diode and the FET may share the same well region. The heavily doped buried layer is formed near the source diffusion region.

Since the heavily doped buried layer is disposed near the source diffusion region, charges generated in the well region of the photo-diode will easily collect in the heavily doped buried layer.

In other words, when the well region is p-type and an n-channel MOS transistor is used as an optical signal detection transistor, then holes are used, and the source diffusion region is set at a lower electric potential than the drain diffusion region. Alternatively, when the well region is n-type and the signal detection transistor is a p-channel MOS transistor, then photo-generated charges are electrons, and the source diffusion region is set to a higher potential than the drain diffusion region. Thus, if the drain diffusion region is supplied with a positive or negative operating voltage VDD, and the gate electrode is supplied with a lower voltage, then an electric field is generated in the well layer so as to accelerate either holes or electrons of the photo-generated charges to move from the drain diffusion region of the FET, i.e. the impurity diffusion region of the photo-diode, to the source diffusion region.

An initialization of the imaging device expels out of the semiconductor layer and substrate the photo-generated charges that remain after a read operation, and holes or electrons that remain in the acceptors or the donors in the well region and the other semiconductor layer to neutralize the acceptors or the donors. The new charges are photo-generated in the well region of the photo-diode. The voltage subsequently applied to the electrode and regions as described above will cause the new photo-generated charges to be transferred to the heavily doped buried layer and stored therein. Once collected in the heavily doped buried layer, the charges cannot easily get out or diffuse out of the heavily doped buried layer because of the lower potential it has there. Thus, the photo-generated charges are effectively stored in the heavily doped buried layer.

The photo-generated charges stored in the heavily doped buried layer can be removed therefrom by applying a voltage which is higher than the operating voltage to the gate electrode, the drain diffusion region, and the source diffusion region to thereby enhance the electric field through the well region.

As the photo-generated charges are stored in the heavily doped buried layer, the Fermi level in the heavily doped buried layer is changed and the space charge therein is decreased corresponding to the amount of the stored charges, so that the threshold voltage of the transistor is lowered. At the same time, as the stored charges in the heavily doped buried layer increases, carriers having the opposite conduction type relative to the stored charges in the heavily doped buried layer is generated in the channel region in accordance with the law of conservation of charges, thereby partially creating a inversion region just over the heavily doped buried layer, so that channel conductance is increased therein.

Since the photo-generated charges are not stored in any region other than the heavily doped buried layer due to a high potential outside the heavily doped buried layer, no further inversion region will be formed in a surface layer of the well region below the gate electrode other than therein right on the heavily doped buried layer, but a strong electric field is generated therein (this region will be referred to as strong-electric field region).

Because of the inversion region and the strong-electric field region formed in the same channel region, the transistor becomes operable under a saturated condition. Thus, if a constant current is supplied to the source of the transistor used in a source follower connection and if an appropriated gate voltage is applied to the gate, the transistor follows the change in the threshold voltage of the transistor and changes the potential in the source diffusion region accordingly.

In addition, since the transistor may operate under a saturated condition, the current passing through it depends only on the voltage difference between the gate electrode and the source diffusion region. Accordingly, the change of the source potential depends only on the amount of the stored charges of the photo-generated charges.

By outputting this source potential as a video signal, an advantageous linear photoelectric charge-voltage conversion may be obtained.

Since the amount of the charges stored in the heavily doped buried layer is balanced by the charges induced in the inversion region, the amount of the charges stored in the heavily doped buried layer is the same as that of the charges supplied to the gate insulating film (acting as a capacitor). Hence, the output of the transistor corresponds to a change in the threshold voltage.

The injected carriers are shared by the distributed capacitance to each transistor nodes, are also responded to the other capacitance components such as the capacitance to drain and substrate causing the loss of threshold modulation sensitivity. Therefore, the highly doped region should be located near the gate electrode and separated from the drain edge to increase the modulation sensitivity.

The charge-storage of the photo-generated charges to the capacitor of the gate insulating film is limited by the capacitance of the gate insulating film just over the heavily doped buried layer acting as the carrier pocket. Therefore, the detection sensitivity of the image sensor is determined from the thickness of the gate insulating film, the area and the depth of the heavily doped buried layer. Moreover, the capacitance can be regarded as constant, so that the image sensor enables a sensitive detection of light based on an excellent linear charge-voltage transfer characteristics.

In general, if a surface of the semiconductor layer is depleted, the depleted region acts as a barrier for holes.

If the transistor has an ordinary photo-gate electrode, the surface of the semiconductor layer filled with the photo-generated charges would reach an electrostatic equilibrium. Then the sensor would suffer from a serious problem such as a generation of a dark current due to a thermal excitation and a potential modulation due to an accumulation of parasitic holes.

On the other hand, the channel region of the transistor of the invention is adapted to hold a depletion condition therein after initialization of the transistor for sweeping remaining charges. In addition, since the transistor is shielded from light, no appreciable carriers will be formed therein. Should certain carriers be trapped on the surface of the semiconductor layer in the transistor, they could not override the potential barrier to become a dark current or noise on the surface.

Briefly stated, the present invention causes the photo-generated charges which control a current through a detection transistor to store in an isolated region in the well region underlying a channel region so that the charges do not interact with a surface layer of a MOS transistor.

By collecting the photo-generated charges in the neighborhood of the source diffusion region, it is possible to control the threshold voltage of the transistor, thereby enabling realization of an ideal threshold voltage modulated CMOS image sensor having a linear response and a high detection sensitivity without generating appreciable noise.

BRIEF DESCRIPTION OF THE DRAWINGS

Preferred embodiments of the invention will now be described in conjunction with the accompanying drawings, in which:

FIG. 2 is a plan view showing a layout for a unit pixel of a solid-state imaging device according to the invention;

FIG. 3 is a cross sectional view showing a structure of a unit pixel of the solid-state imaging device of FIG. 2, taken on line A—A of FIG. 2;

DETAILED DESCRIPTION OF THE PREFERRED EMBODIMENT

Figure 1A:
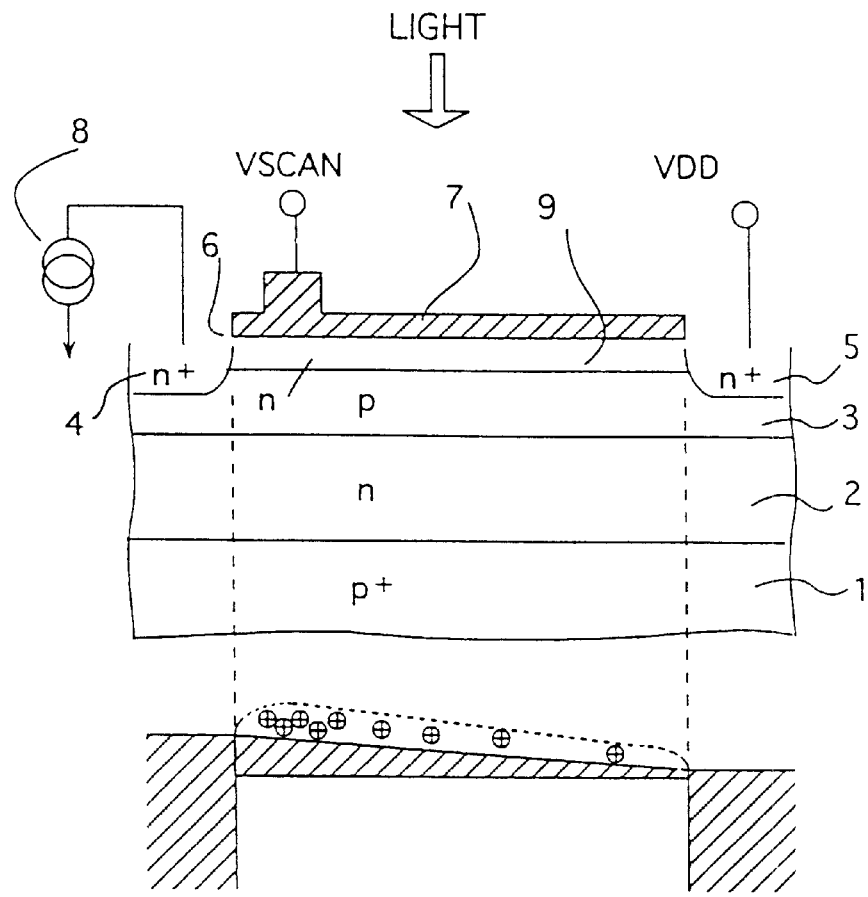
FIG. 1A is a cross section of a major portion of a prior art solid-state imaging device having a BCMD structure.
Figure 1B:
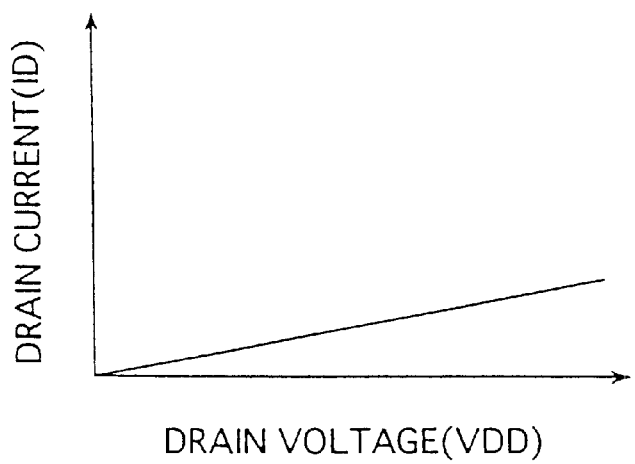
FIG. 1B is a graph showing a current-voltage characteristic of the solid-state imaging device of FIG. 1A.

The embodiment of the present invention is described in detail hereinafter with reference to the accompanying drawings.

FIG. 2 is a plan view showing a layout of a unit pixel of a CMOS image sensor according to the embodiment of the present invention.

As shown in FIG. 2, the unit pixel 101 includes a photo-diode 111 and a photo-detector 112 for detecting a light signal, which is a MOS transistor arranged adjacent to the photo-diode 111. The photo-diode 111 and the MOS transistor 112 shares a well region 15, so that the well region 15 serves on one hand for the photo-diode 111 as a region for generating charges when it is illuminated with light, and serves on the other hand as a gate region for the MOS transistor 112.

The photo-diode 111 has an impurity diffused region 17 which is formed integral with a drain diffusion region 17a of the MOS transistor 112 on the well region 15. The drain diffusion region 17a is formed so as to surround a ring shaped gate 19. Formed in the central region surrounded by the ring shaped gate 19 is a source diffusion region 16. Formed within the well region 15 underlying the ring shaped gate 19 and surrounding the source diffusion region 16, is a carrier pocket (heavily doped buried layer) 25.

It should be understood that an n-type impurity layer (the opposite conductivity type impurity layer) is formed in the channel region of the MOS transistor 112 so that the channel region is depleted, or inverted, while the MOS transistor 112 is in operation.

The drain diffusion region 17a is connected with a drain voltage (VDD) supply line 22, and the gate electrode 19 is connected with a vertical scanning signal (VSCAN) supply line 21, and the source diffusion region 16 is connected to a vertical output line 20.

In regions other than a light sensing window 24 of the photo-diode 111 a signal light is shielded by a metallic light shielding film 23.

The device structure of the CMOS imaging sensor of the present invention will now be described with reference to the accompanying drawings.

The figure shown in the upper section of FIG. 3 is a cross section showing a structure of the CMOS imaging sensor according to the invention, which corresponds to the cross section taken on line A—A of FIG. 2. The figure shown in the lower section of FIG. 3 shows a potential profile along the surface of the semiconductor substrate.

Figure 4A:
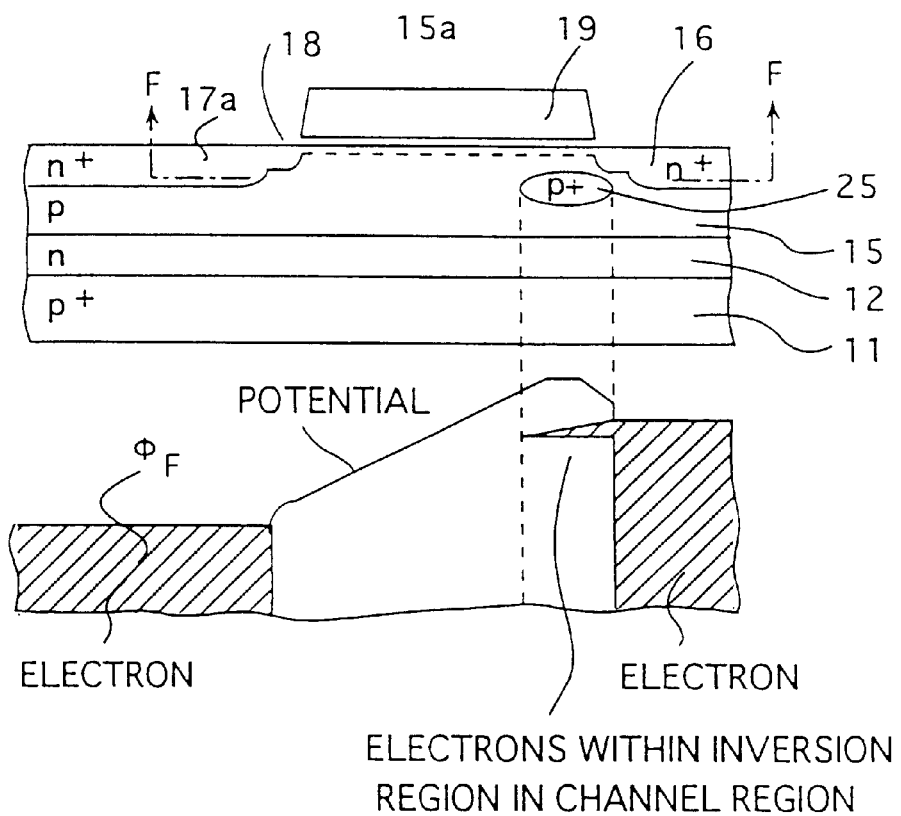
FIG. 4A is a detailed cross sectional view showing a structure of a carrier pocket and its surrounding area in a unit pixel of the solid-state imaging device shown in FIG. 2.

The figure shown in the upper part of FIG. 4A is a detailed cross section of a region centered around the carrier pocket 25 in the well region 15 below the channel region. The figure shown in the lower part of FIG. 4A shows a potential profile along a plane, corresponding to the line F—F of the upper part of FIG. 4A, which is parallel with the surface of the semiconductor substrate, in a case when photo-generated holes are stored in the carrier pocket 25.

Figure 4B:
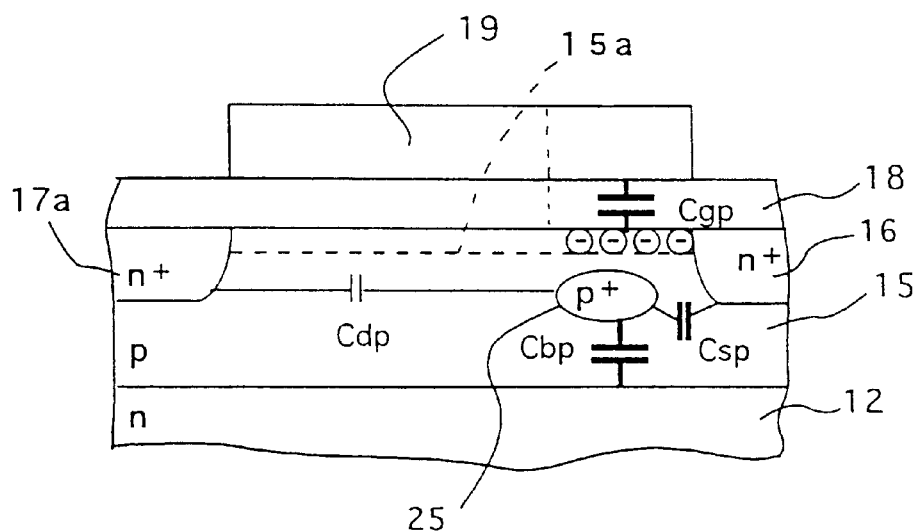
FIG. 4B is a cross sectional view showing the equivalent circuit around the gate region including carrier pocket region.

As a matter of fact, the injected carriers are shared by the capacitance components to the individual transistor nodes, which are capacitance to source (Csp), capacitance to substrate (Cbp), capacitance to drain, (Cdp), and capacitance to Gate (Cgp) as shown in FIG. 4B. Among these factors, the Cgp should be a dominant factor excluding the Csp, which is the output node to increase the potential response for the injected carriers. Therefore, the injected carriers are distributed sharply at the heavily doped region by reducing the Cbp and Cdp, which can be realized by separating the heavily doped region from the drain edge and substrate. Meanwhile, the sensitivity can be also enhanced at the smaller area of the highly doped region, since the detecting capacitance (Cgp) is also determined by area of the highly doped region.

Figure 5:
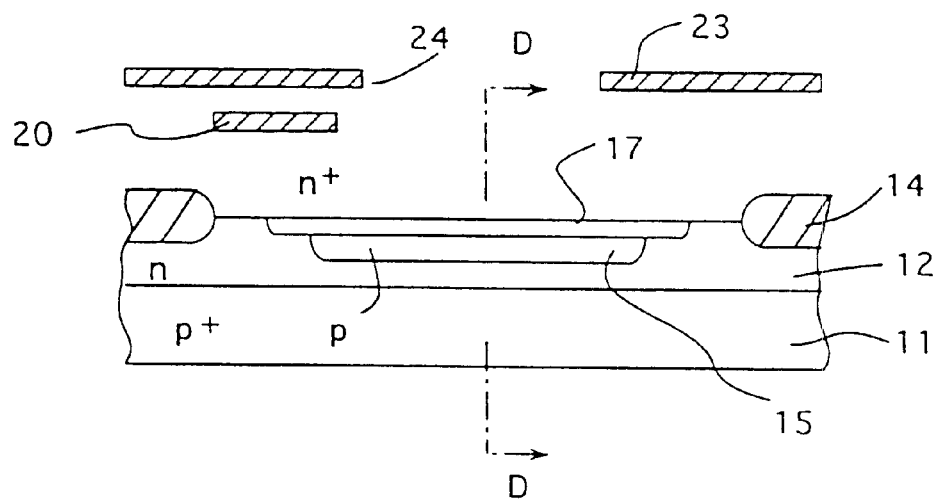
FIG. 5 is a cross sectional view taken on line B—B of FIG. 2, showing a structure of a photo-diode within the unit pixel of FIG. 2.
Figure 6:
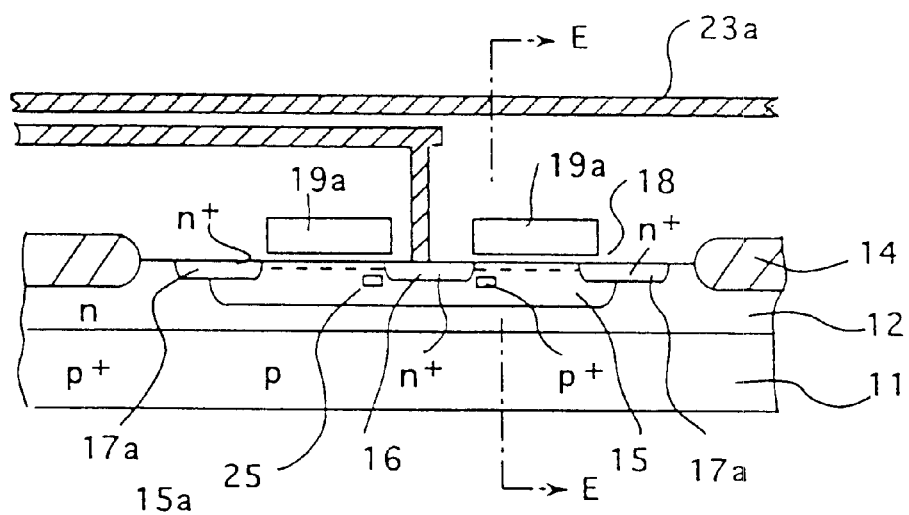
FIG. 6 is a cross sectional view taken on line C—C of FIG. 2, showing a structure of a CMOS transistor for light-sensing within a unit pixel of FIG. 2.

FIGS. 5 and 6 are cross sections taken on lines B—B and C—C, respectively, of FIG. 2.

As shown in the upper section of FIG. 3, an n-type silicon layer 12 is epitaxially grown on a p-type silicon substrate 11, forming a semiconductor substrate of the invention.

The p-type well region 15 is formed on the n-type layer 12. A field insulation film 14 and an element separation diffusion region 13 underlying the field insulation film 14 are formed between two neighboring pixels.

Referring to FIGS. 3 and 5, the photo-diode 111 will now be described in detail.

The photo-diode 111 comprises mainly of the well region 15 and an impurity diffusion region 17 which is formed on the surface of the n-type silicon layer 12 to cover most part of the well region 15. That is, the photo-diode 111 has an buried structure for holes, wherein the holes are mainly generated in the well region 15 below the impurity diffusion region 17.

The impurity diffusion region 17 is connected to the drain voltage (VDD) supply line 22 and biased to a positive potential, which facilitates holes generated by incident light to collect in the well region 15 underlying the impurity diffusion region 17, thereby reducing noise through no interaction with the semiconductor surface in which many surface trap levels exist.

Referring to FIGS. 3 and 6, optical signal detection n-MOS transistor 112 will now be described in detail. The MOS transistor 112 has a structure in which the ring shaped gate electrode 19 is surrounded by the n+-type drain diffusion region 17a which is formed integrally with the n+-type impurity diffusion region 17. The n+-type source diffusion region 16 is formed in the center region surrounded by the gate electrode 19. The gate electrode 19 is formed on a gate insulation layer 18 which is deposited on the well region 15 extending between the drain diffusion region 17a and the source diffusion region 16. The surface layer of the well region 15 underlying the gate electrode 19 serves as the channel region.

The p+-type carrier pocket 25 is formed in the well region 15 in such a way that the carrier pocket 25 surrounds the source diffusion region 16 and extends only partially along the length of the channel region. This p+-type carrier pocket 25 can be made by an ion implantation method, for example. It should be noted that the carrier pocket 25 is formed in the well region 15 to underlie the channel region, rather than in the surfacing channel region itself. The carrier pocket 25 need to be formed not to overlie the channel region. In addition, in order to hold the channel region inverted or depleted under a normal operating voltage, it is necessary to form an impurity layer 15a by introducing appropriate concentration of n-type impurity in the channel region.

The above described p+-type carrier pocket 25 has a lower potential for photo-generated holes than for electrons, so that photo-generated holes are collected in the carrier pocket 25 when a high voltage is applied to the drain diffusion region 17a. The figure depicts a manner in which photo-generated holes are accumulated in the carrier pocket 25.

Shown in the lower section of FIG. 3 is a potential profile when photo-generated holes are accumulated in the carrier pocket 25 so that electrons are induced in the channel region, i.e. a inversion region is formed therein. The arrangement of the element near the carrier pocket 25 in the well region 15 under the channel region and the associated potential profile are shown in FIG. 4.

Figure 7A:
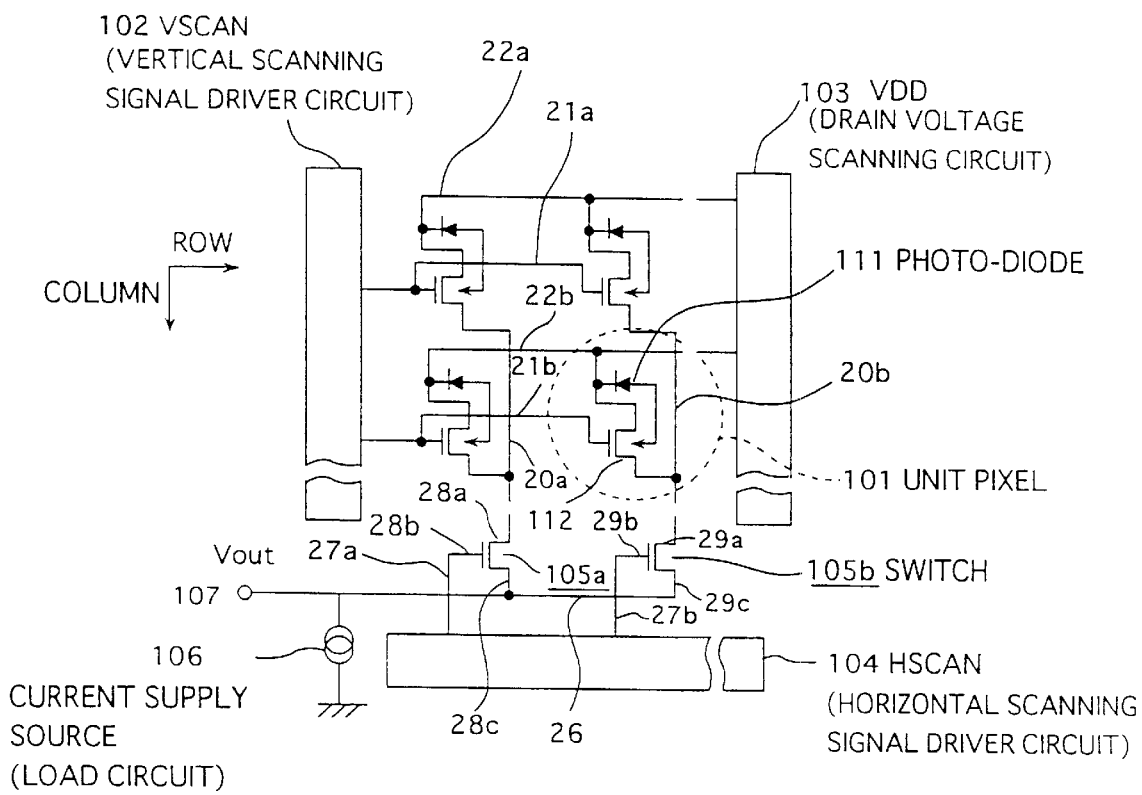
FIG. 7A is a circuit diagram of the solid-state imaging device of FIG. 2.

Next, referring to FIGS. 7A and 7B, the CMOS image sensor utilizing the above described unit pixels will now be described. FIG. 7A shows a circuit diagram for the CMOS imaging sensor according to the invention. The CMOS imaging sensor has two-dimensional array of unit pixels arranged in a matrix form, i.e. arranged in rows and columns, as shown in FIG. 7A. In the example shown in FIG. 7a, the image sensor comprises a 2×2 matrix for simplicity.

Provided on one side of pixel matrix is a vertical scanning driver circuit 102 for providing the matrix with a vertical scanning signals (VSCAN), and on the opposite side of the matrix is a VDD scanning driver circuit 103 for providing the matrix with a drain voltage VDD.

The drains of the MOS transistors 112 in the unit pixels 101 in each row, are connected with the VDD scanning driver circuit 103 via voltage supply lines 22a and 22b associated with the row to receive the drain voltage VDD. The gates of the MOS transistors 112 in the unit pixels 101 in each row are connected with the vertical scanning driver circuit 102 via vertical scanning signal lines 21a and 21b associated with the row to receive the vertical scanning signal VSCAN.

The sources of the MOS transistor 112 in the unit pixels 101 in each column are connected with the vertical output lines 20a and 20b associated with the column.

The vertical output lines 20a and 20b are connected with the respective drains (light detection signal input terminals) 28a and 29a of MOS transistors serving as column switches 105a and 105b, respectively, for the respective columns. The gates (horizontal scanning signal input terminals) of the switches 105a and 105b are connected with a horizontal scanning driver circuit 104 for horizontal scanning signals (HSCAN).

The sources (light detection signal output terminals) 28c and 29c of the switches 105a and 105b, respectively, are connected with a video signal output terminal 107 via a common constant current supply source 106. In other words, the source of the MOS transistor 112 in each unit pixel 101 is connected with the constant current supply source 106 to form a source follower circuit. Thus, the gate-source voltage and bulk-source voltage of the transistor are determined by the constant current supply source (load circuit) 106.

The MOS transistors 112 in the unit pixels are sequentially activated by the vertical scanning signal (VSCAN) and the horizontal scanning signal (HSCAN), resulting in a sequence of video signals (Vout) representing the amounts of light received by the diodes 111 in the respective pixels.

As describe above, since each unit pixel 101 consists of a photo-diode 111 and a MOS transistor 112, pixels of the imaging device may be integrated together by a CMOS process, along with the scanning driver circuits 102–104 and other peripheral circuits including the constant current supply source 106, on the same semiconductor substrate.

Figure 7B:
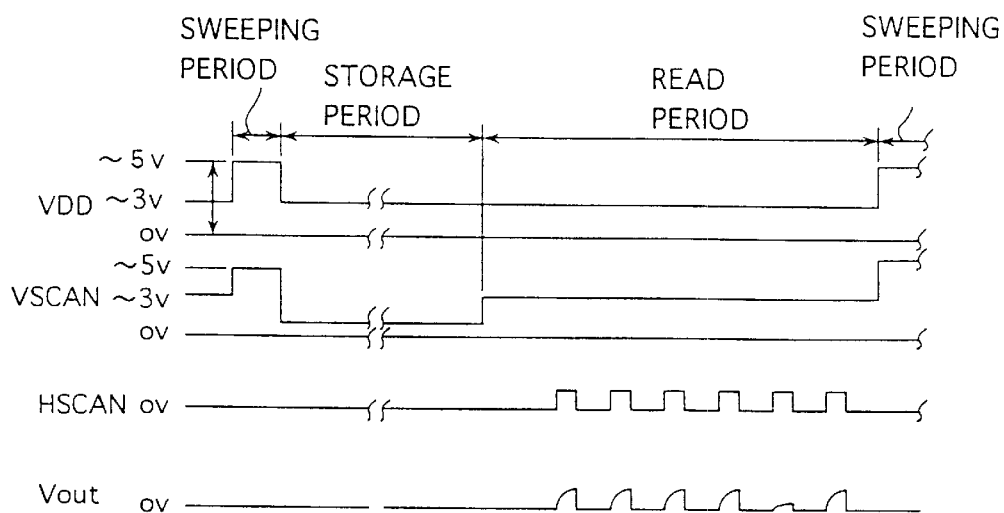
FIG. 7B is a timing chart for the operation of the circuit shown in FIG. 7B.

FIG. 7B is a timing chart for various input/output signals required for operation of the CMOS imaging sensor of the invention. This timing chart is applied to an imaging sensor which has p-type well regions 15 and n-MOS type light detection transistors 112.

The imaging device has a cycle consisting of sweeping (initialization), photo-carrier generation, charge storing, and reading stages.

During the cycle, the electric potential in each of the well regions 15 in the unit pixels 101 varies as will be described in detail below with reference to FIGS. 8, 9, and 10. The current-voltage characteristic of the light detection MOS transistor 112 in each unit pixel 101 will be understood with reference to FIG. 11.

Figure 8A:
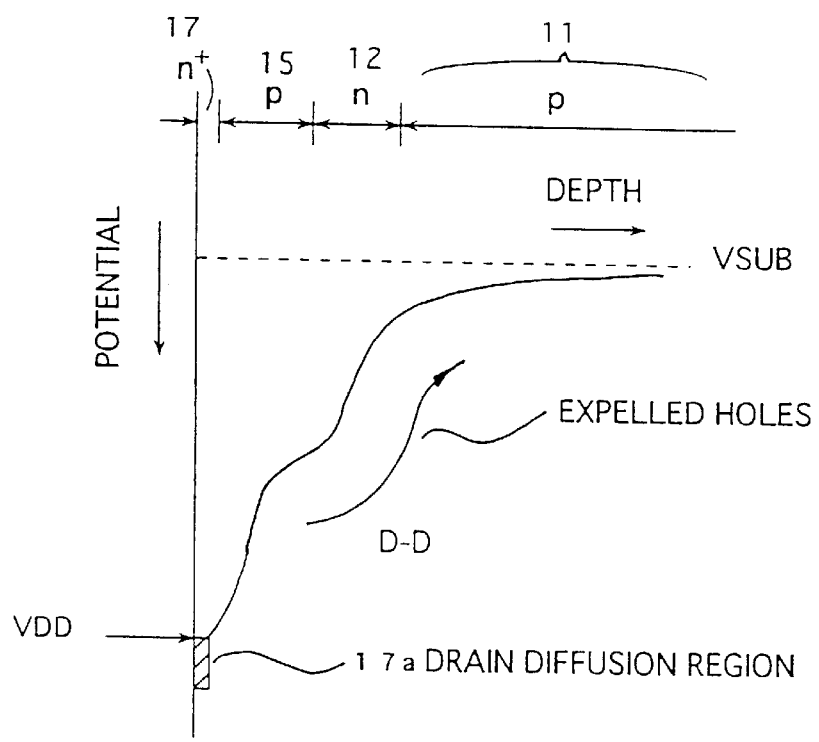
FIG. 8A is a potential profile along the cross section taken on line D—D of FIG. 5 during a initializing period of operation.
Figure 8B:
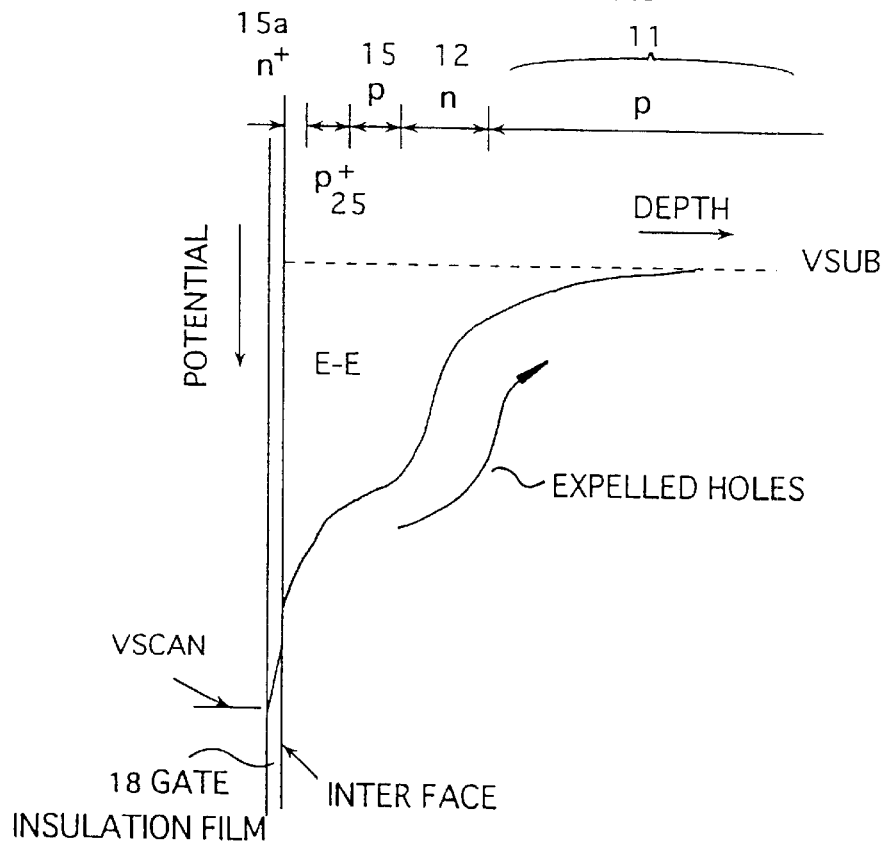
FIG. 8B is a diagram illustrating a potential profile along the cross section taken on line E—E of FIG. 5 during a initializing period of operation.
Figure 9A:
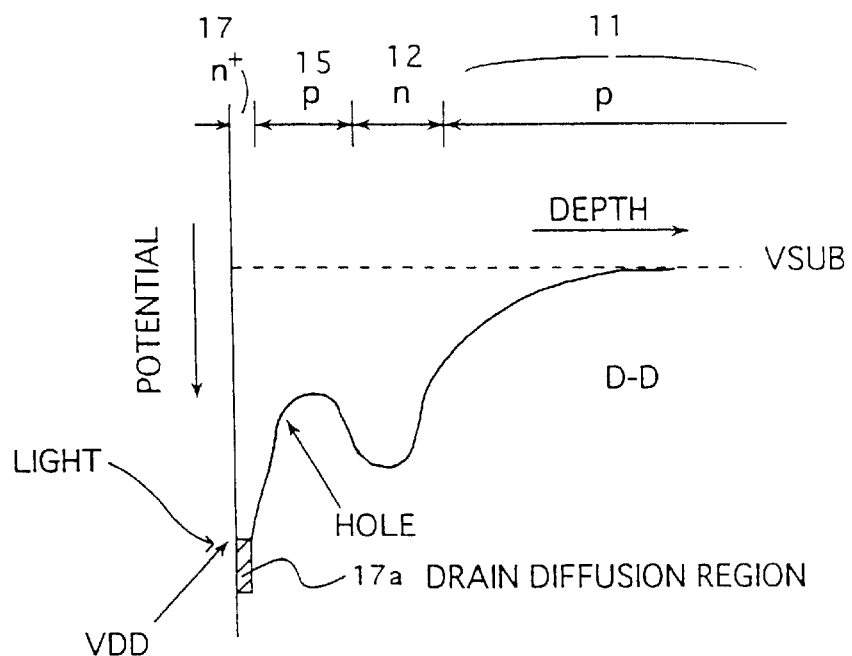
FIG. 9A is a potential profile along the cross section taken on line D—D of FIG. 5 during a charging period of operation.
Figure 9B:
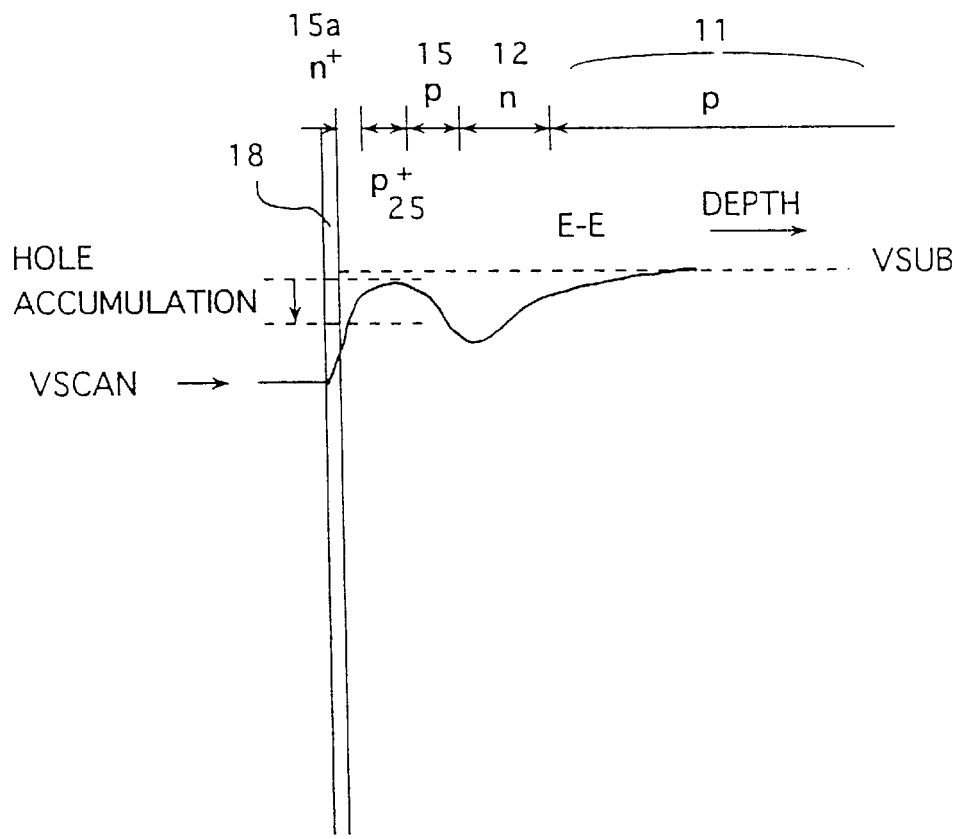
FIG. 9B is a potential profile along the cross section taken on line E—E of FIG. 5 during a charging period of operation.
Figure 10A:
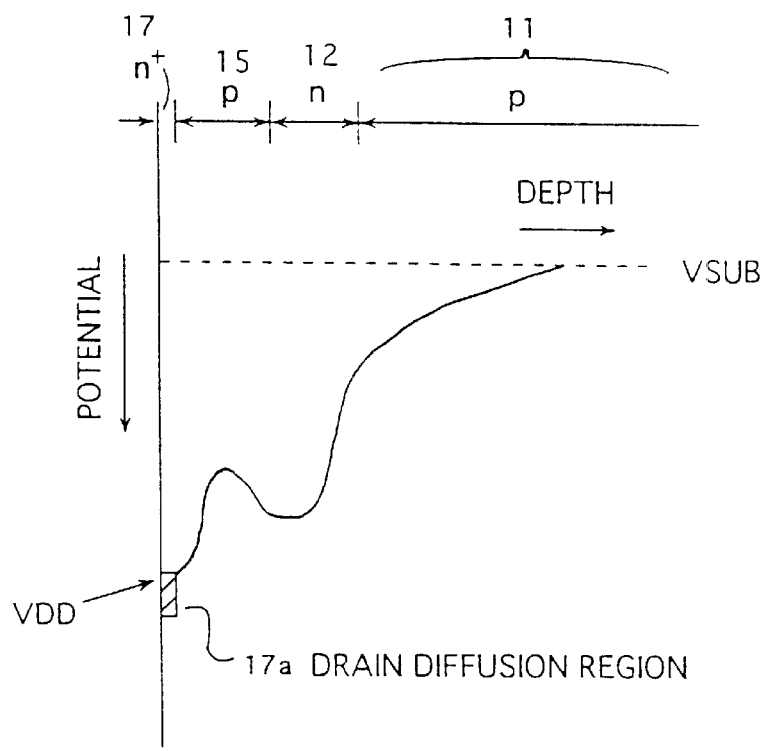
FIG. 10A is a potential profile along the cross section taken on line D—D of FIG. 5 during a read period of operation.
Figure 10B:
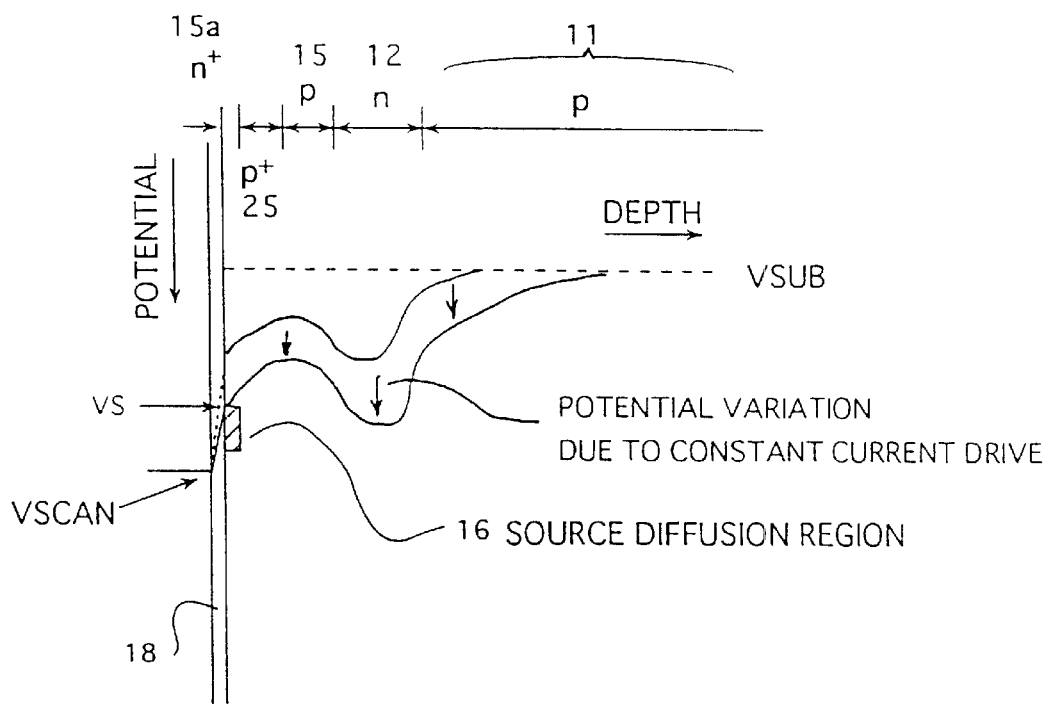
FIG. 10B is a potential profile along the cross section taken on line E—E of FIG. 5 during a read period of operation.

In each of FIGS. 8–10, the ordinate represents the potential, while the abscissa represents the depth from the surface of the substrate. FIGS. 8A, 9A, and 10A represent the potential distributions taken on line D—D of FIG. 5 at sweeping (initialization), charge storing, and reading, stages of the cycle, respectively. Similarly, FIGS. 8B, 9B, and 10B represent the potential distributions taken on line E—E of FIG. 6 at sweeping (initialization), charge storing, and reading, stages of the cycle, respectively.

In the sweeping period, charges that remain in the semiconductor after a read, holes and electrons neutralizing the acceptors and donors, and holes and electrons trapped in the surface states are expelled out of the semiconductor. This operation, referred to as initialization, is performed for each row.

An important aspect of the sweeping operation is to dear the carrier pocket 25 for the next photo-generated charges to be stored therein. In other words, it is intended to detect only the photo-generated charges as a video signal, avoiding picking up noise due to remaining charges.

In this operation, the drain diffusion region 17a, the gate electrode 19, and the source diffusion region 16 are supplied with a voltage which is greater than the normal operating voltage. This is done by applying VDD of about +5 volts to the drain diffusion region 17a via VDD supply lines 22a and 22b, and applying about +5 Volts to the gate electrode 19 via VSCAN supply lines 21a and 21b. The source diffusion region 16 is also supplied with the same voltage (+5 Volts) as the drain diffusion region 17a, since the channel region is rendered conductive by the gate voltage.

As shown in FIGS. 8A and 8B, this voltage acts as a reverse bias across the p+-junction, so that the electric field in the well region 15 is directed to the p+-substrate 11 through n- and p-regions, whereby the holes that remain in the well region 15 and other sections in the semiconductor are swept out through the p+-substrate 11 while electrons remaining in the semiconductor are swept out through the source diffusion region 16 and the drain diffusion region 17. It should be recognized that particularly the photo-generated charges stored in the carrier pocket 25 cannot be expelled therefrom by a standard gate and drain voltages to saturate the transistor, but that the charge can be expelled from the carrier pocket 25 by applying a gate voltage and a drain voltage which are higher than the standard voltages by 5 Volts, for example.

The well region 15 becomes depleted when the remaining charges are swept.

As described above, the initialization operation mentioned above is ideal in sweeping charges to obtain imaging signals, since it will leave no charge that can result in thermal noise (kTC noise) or thermal fluctuation in carrier density.

It would be appreciated that the initialization may be carried out by means of an on-chip booster circuit implemented in the substrate, since no current path is involved in the initialization.

The storage period is needed to generate a charge through illumination of light and to store the charges in the carrier pocket 25. During the storage period, an electronic row-wise shutter may be used to activate only a relevant row of pixels in a currently proceeding horizontal scanning.

In this case, a voltage of about 2 to 3 Volts is applied to each of the drain diffusion regions 17 of the MOS transistors 112 in all unit pixels 101 so as to activate the MOS transistors via VDD supply lines 22a and 22b prior to illumination of light. At the same time a low, yet sufficient, voltage is applied to each of the gates of the MOS transistors in each column via VSCAN supply lines 21a and 21b, so as to render the MOS transistors cut-off. Thus, the charge storing operation is done for all the sensors coupled with the respective horizontal scanning signal lines.

With the drain diffusion regions 17a supplied with the voltage, majority carriers (holes) in the p-type well region 15 are swept to the p+-type substrate 11, so that the well region 15 is depleted, leaving only a negatively charged space charge layer of acceptors.

If a pixel is illuminated by light, electron-hole pairs are generated in the well region 15 of the photo-diode 111 associated with the pixel.

Under the condition that the gate of the MOS transistor is set at a low potential, the photo-generated electrons are driven out of the drain diffusion region 17 by the drain voltage, while the photo-generated holes are attracted by the low potential in the source diffusion region 16 towards the source diffusion region 16 until they are trapped or stored in the carrier pocket 25 where the electric potential is minimum, as shown in FIGS. 9A and 9B.

Since charge transfer of the photo-generated charges during the charge storing period is done only within the p-type well region 15, the charge transfer is not affected by the surface condition of the semiconductor, and hence generating no noise.

It is noted that, if the surface of the transistor is depleted, it becomes a barrier for the holes.

Figure 12A:
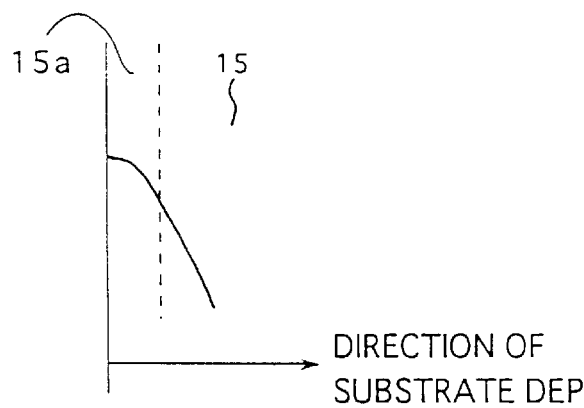
FIG. 12A is a surface potential profile in the channel region of the solid-state imaging device shown in FIG. 2, immediately after the initialization thereof.
Figure 12B:
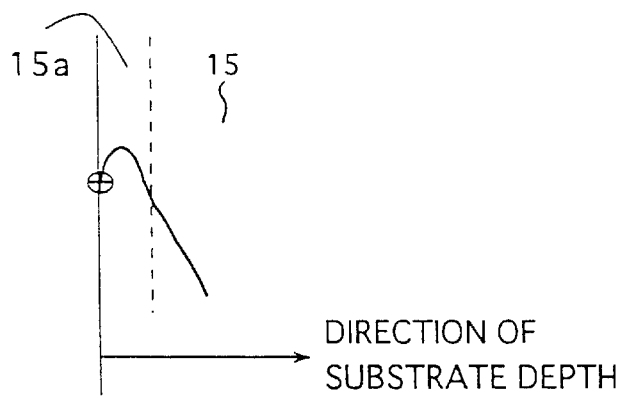
FIG. 12B is a surface potential profile in the channel region of the solid-state imaging device shown in FIG. 2, when light is shielded.
Figure 12C:
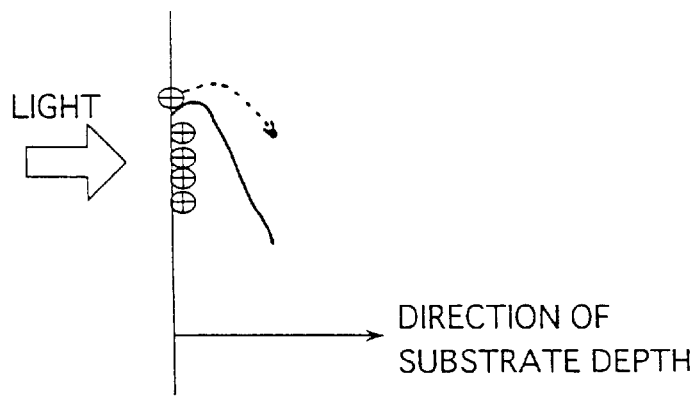
FIG. 12C is a surface potential profile in the channel region of a prior art solid-state imaging device, subsequent to illumination of light.

In a prior art photo-gate electrode configuration as shown in FIG. 12C, the surface of the semiconductor is filled with photo-generated charges, which are in electrostatic equilibrium and can be a source of dark current and parasitic holes which in turn poses a potential modulation problem.

In contrast, in the example shown herein, the channel region of the transistor is depleted and remains so after initialization, as shown in FIG. 12A. Furthermore, since the gate and the nearby region are shielded from light, no excessive carrier layer is generated. Hence, if carriers are trapped in the surface of the transistor, as shown in FIG. 12B, it cannot override the barrier to become a dark current or noise through the surface.

The read period is needed to read out video signals (Vout) associated with the photo-generated charges stored in the respective pixels. The video signal Vout may be read by activating the optical signal detection MOS transistor 112 connected as a source follower.

In this case each of the drains of the MOS transistors 112 in each row is provided with a voltage of about 2 to 3 Volts via VDD supply lines 22a and 22b, and each of the gates of the MOS transistors 112 in each row is provided with a voltage of about 2 to 3 Volts via VSCAN supply lines 21a and 21b, so that the MOS transistors 112 operates under a saturated condition. The sources of the photo-detection MOS transistors 112, connected with the constant current supply 106, are supplied with a constant current.

A photo-generated carrier is stored in the carrier pocket 25 within a period immediately before a read period.

When the photo-generated carriers are stored in the carrier pocket 25, then Fermi level in the well region 15 is changed in relation to the amount of the charges stored therein. Then the space charges decrease, lowering the threshold voltage of the transistor. At the same time, in accordance with the law of charge conservation, an inversion region is formed above the carrier pocket 25, where the same amount of electrons as the holes stored in the carrier pocket 25 are increased to result in an increase of a channel conductance. In this case, a surface potential just above the carrier pocket 25 is approximately constant in a direction of the channel length, electron carriers are distributed in the uniform density.

On the other hand, because the space charge density is sufficiently low in the drain diffusion region 17a side of the well region 15, no inversion region is generated in the drain diffusion region 17a side of the channel region, and instead a region of a strong electric field is generated therein.

Figure 11:
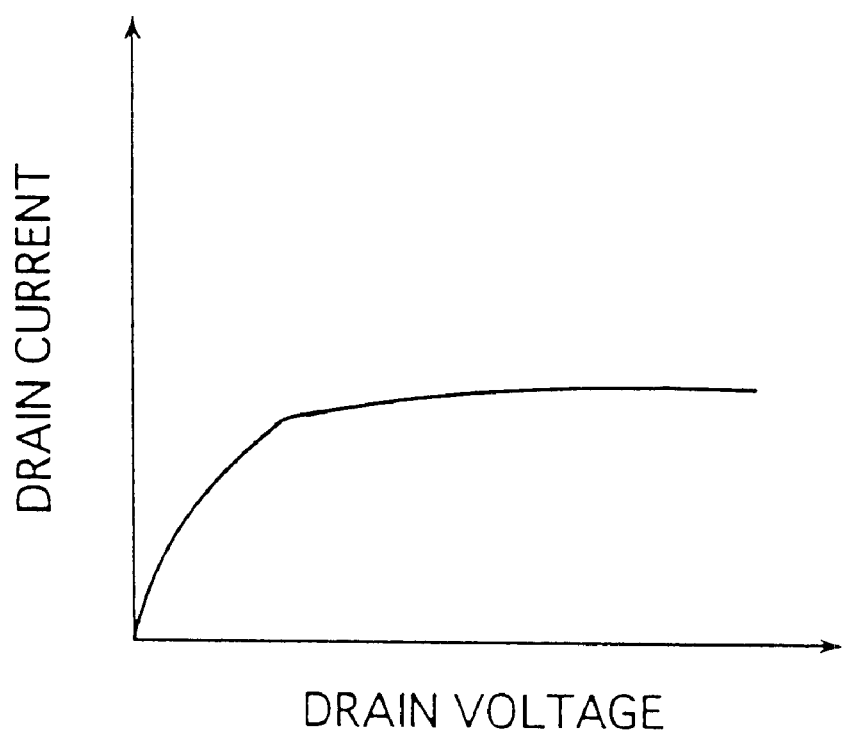
FIG. 11 is a graph showing a current-voltage characteristic of a optical signal detection MOS transistor within a unit pixel of the solid-state imaging device shown in FIG. 2.

Because of the inversion region generated in one part of the channel region and the strong field region on the other part thereof, the optical signal detection MOS transistor 112 is now operable under a saturated condition as shown in FIG. 11.

Hence, if a set of standard operating voltages is applied to the respective electrodes of the optical signal detection MOS transistor 112, the transistor in saturated condition is activated. The transistor 112, connected with the constant current source, operates as a source follower: it decreases the difference between the gate and source potential via a negative feedback thereof so as to flow a constant current through the transistor, thereby raising the source potential as shown in FIGS. 10A and 10B. The change in source potential is read out from the output terminal 107 as its video signal.

The above described read operation may be interpreted as follows. Because the optical signal detection MOS transistor 112 operates in a saturated region as shown in FIG. 11, the drain-source potential difference is determined by the potential in the well region 15 below the gate electrode 19. The potential difference results in generation of an electric field towards the source diffusion region 16 in the p-type well region 15.

Although photo-generated holes raise the Fermi level in the neighborhood of the source diffusion region 16, the height of the potential barrier is conserved since the current is determined by the constant current source 106. Consequently, a change appears in the source potential Vs that corresponds to the voltage difference associated with the space charge neutralized by the injection of photo-generated holes, as shown in FIG. 10A and 10B. In other words, the bulk potential of the semiconductor may be changed by the photo-generated holes so as to change the output of the source follower.

Figure 13A:
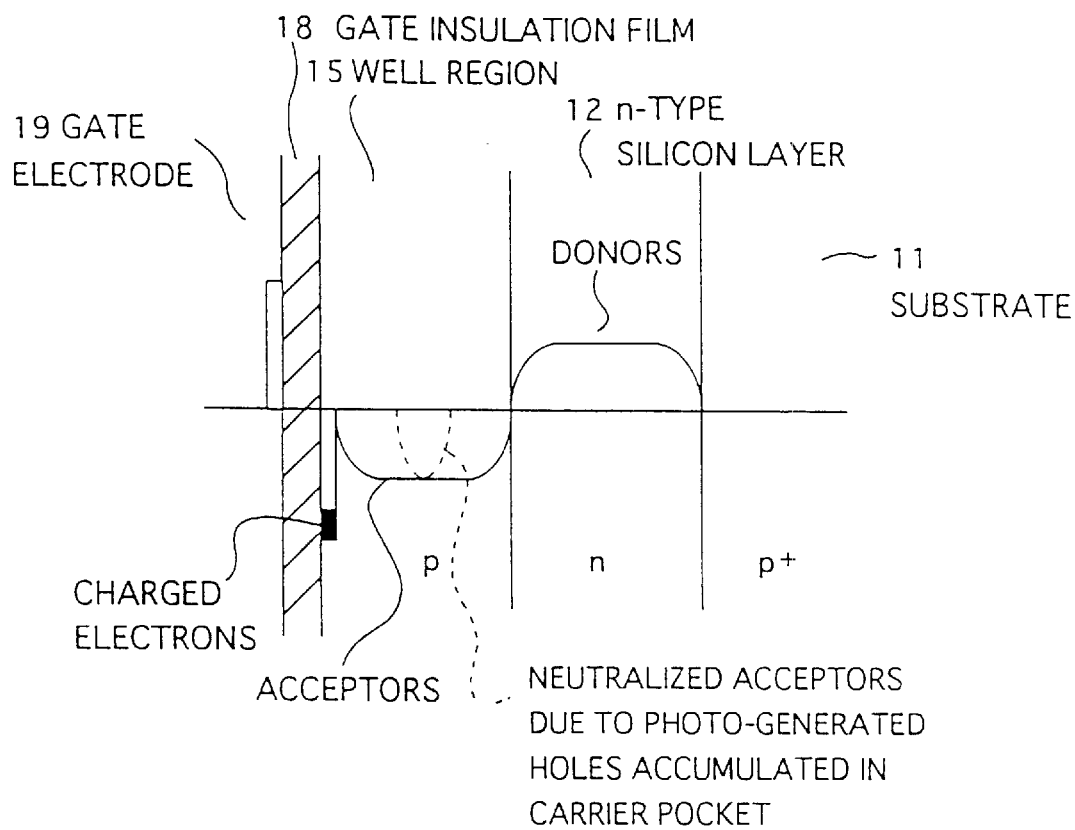
FIG. 13A is a charge distribution in the solid-state imaging device shown in FIG. 2 during charging and read operations.
Figure 13B:
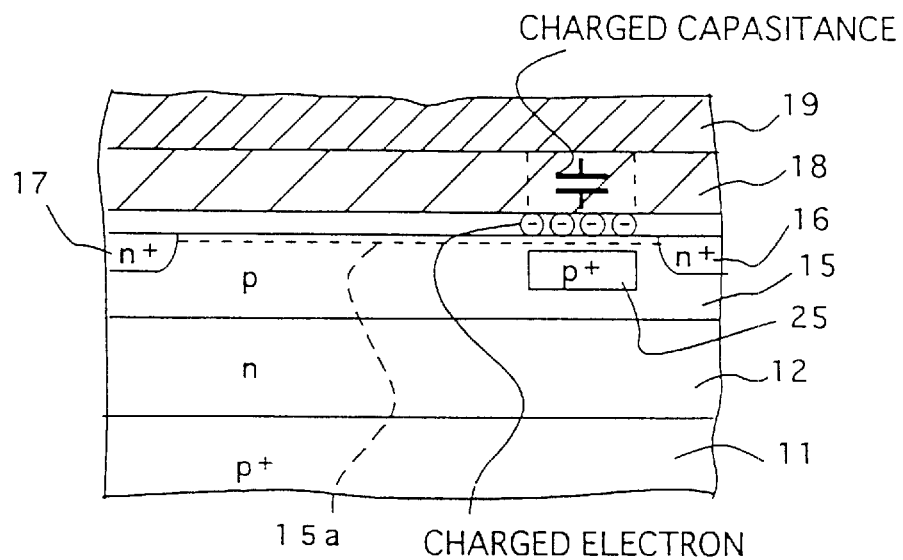
FIG. 13B is a cross sectional view of a portion of the MOS transistor shown in FIG. 6 in the neighborhood of a carrier pocket, useful in explaining FIG. 13A.

In this manner, it is possible to obtain a video signal (Vout) which is proportional to the amount of light irradiated. Since in this case the photo-generated holes and the electrons appearing in the inversion region are quantitatively balanced, the amount of photo-generated charges is the same as the charges induced in the gate insulator film 18 (acting as a capacitor), and the change in threshold voltage may be detected. As shown in FIGS. 13A and 13B, charging by the photo-generated charges is limited to the gate insulator film 18 above the carrier pocket 25, so that the detection sensitivity of the photo-sensor may be determined from the thickness of the gate oxide film 18, and the area and the depth of the carrier pocket 25. A linearity of charge-voltage conversion of the photo-sensor is good because the photo-generated charges are stored in a limited region of the carrier pocket 25.

In addition, since the detection capacitance can be regarded as constant, it enables a very sensitive detection of the photo-carriers based on an extremely linear charge-voltage conversion.

Referring now to FIGS. 7A and 7B, operation of the solid-state imaging device associated with photo-detection will now be described In photo-detection, the charges that remain in the well region and other sections of the semiconductor are swept out by initialization thereof, as previously described.

Next, a low voltage is applied to the gate electrode 19 of the transistor; voltage VDD in the range of about 2 to 3 Volts is applied to the drain diffusion region 17a for activating the transistor, causing the well region 15 to be depleted and resulting in an electric field directed from the drain diffusion region 17a to the source diffusion region 16.

Upon illumination of light, electron-hole pairs are generated, wherein the holes are injected into the gate region and stored in the carrier pocket 25. The stored holes limit the width of the depletion layer extending from the channel region towards the substrate 11, and the potential is changed near the source diffusion region 16, so that the threshold voltage of the MOS transistor 112 is changed by the carriers in the pocket 25.

When the gate electrode 19 is supplied with a voltage of about 2–3 Volts and the drain diffusion region 17a is supplied with voltage VDD of about 2–3 Volts to enable the MOS transistor 112 to operate under a saturated condition, a weak electric field is formed in an inversion region of the channel region, and a high electric field is formed in the rest of the channel region.

If, at this stage, the source diffusion region 16 of the MOS transistor 112 is connected with the constant current source 106, the MOS transistor 112 forms a source follower circuit, thereby varying its source potential, and hence the output voltage, that follows the change in threshold voltage of the MOS transistor caused by the photo-generated holes. Accordingly, a video signal is obtained corresponding to the amount of light illuminated.

As described above, in accordance with the invention, an ideal CMOS imaging device may be provided wherein photo-generated charges may be swept (initialized), stored, and read without being affected by noise sources in the channel regions and the semiconductor surface.

It will be recalled that the carrier pocket 25 is formed below the channel region, an inversion region is formed in a partial region of the channel region, leaving the rest of the channel region impressed with a strong electric field, so that the transistor can be activated to operate under a saturated condition. Moreover, the MOS transistor is connected in a source follower, its source voltage follows the change in threshold voltage that corresponds to the stored photo-generated charges. Thus, a good linear charge-voltage conversion may be obtained by reading the source voltage.

This feature of the invention can be better appreciated when it is compared with conventional BCMD type solid-state imaging devices, which have a triode-like current-voltage characteristic and are therefore difficult to operate under saturated conditions or attain linear photoelectric conversion.

In the invention, a photo-sensor has a photo-diode 111 and a optical signal detection MOS transistor 112 separately. Accordingly, deterioration of spectral sensitivity caused by multiple interference of incident light that takes place on the photo-gate electrode may be prevented.

By the simple combination of the photo-diode 111 and the optical signal detection MOS transistor 112, the fill factor of the photo-sensor may be improved.

Fixed pattern noise may also be suppressed by varying the gate voltage of the source follower as described above so as to adjust the gain of the source follower and the source capacitance.

In the foregoing examples, a optical signal is obtained by forming a p+-type carrier pocket 25 in an n-MOS transistor (optical signal detection MOS transistor) 112 to store photo-generated holes. However, it will be understood by a person of skill in the art that the detection of the optical signal may be detected equally well by forming an n+-type carrier pocket in a p-MOS transistor (optical signal detection MOS transistor) to store photo-generated electrons.

In the example shown in FIG. 7A, the solid-state imaging device is adapted to supply a gate voltage of about +5 Volts to the gate electrode 19 during a sweeping period, which renders the channel region conductive to thereby impress on the source diffusion region 16 the same voltage of about +5 Volt as applied to the drain diffusion region 17a. Alternatively, the source diffusion region 16 may be connected with a power source via a switching means such that the power source provides the source diffusion region 16 with a voltage of about +5 Volts only during a sweeping period.

Referring again to FIG. 7a, a constant current source is shown to be a load circuit. The load may be replaced by a capacitive load using a capacitor. In that case, the capacitor is charged as the source voltage is changed by photo-generated charges collecting in the carrier pocket. The voltage across the capacitor may be read out as a video signal. Further, instead of such capacitive load, a high impedance load circuit may also be used to form a source follower.

It can thus be seen that there has been provided by the present invention a new and useful threshold voltage modulation solid-state imaging device which includes a common well region shared by a photo-diode and an insulator gate type FET, and a heavily doped buried layer (carrier pocket) formed in the well region under the channel region and near the source diffusion region of the FET.

Accordingly, the photo-generated charges generated in the photo-diode are transferred therefrom into the carrier pocket of the transistor through a bulk of the semiconductor layer and subsequently stored in the carrier pocket to thereby change the threshold of the transistor.

This arrangement facilitates suppression of both thermal noise (kTC noise) and noise that arises from charge captures on the semiconductor surfaces, throughout the optical signal detection consisting of aforementioned steps: sweeping (initialization); photoelectric conversion; storing the photo-generated charges in the carrier pocket; and voltage read out.

Thus, the invention provides a low-noise solid-state imaging device equipped with MOS type image sensors having a superior performance over a conventional CCD image sensors.

It should be appreciated again that in the invention the carrier pocket of a MOS transistor is provided under the channel region of the transistor. The carrier pocket enables shared formation of an inversion region and a strong field region around the inversion region in the channel region, so that the transistor is operable under a saturated condition.

In addition, the transistor is included in a source follower circuit, with its source connected to a high impedance load circuit such as a constant current source, so that the amount of the photo-generated charges may be advantageously converted linearly to a change in the threshold voltage of the transistor, which can be detected as a change in the source voltage. It enables a good linear light-voltage conversion.

The invention may be carried out by a simple combination of a photo-diode and an optical signal detection MOS transistor. Thus, the invention is capable of providing an improved fill factor thereof.

The feature of the invention that the gain of the source follower and the source capacitance may be easily adjusted facilitates suppression of fixed pattern noise.

The solid-state imaging device of the invention may be manufactured conveniently at low cost because it can be integrated with peripheral circuitry on the same substrate using a conventional CMOS fabricating technology.

Figure 14:
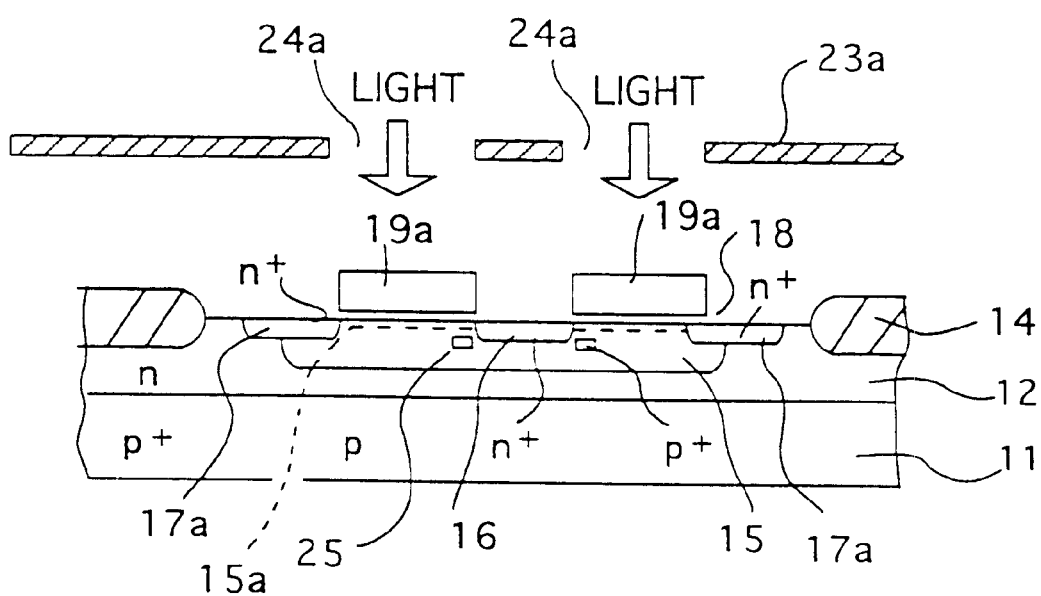
FIG. 14 is a cross sectional view showing another structure of a unit pixel of the solid-state imaging device.

Besides, though the detailed example of the present invention was described in the above preferred embodiment, an another modulated example as shown in FIG. 14 may also be considered.

In FIG. 14, a different point from FIGS. 2 to 6 is to be provided with a structure such that a signal light directly comes to a gate region 15 through a gate electrode 19a. In other word, no photo-diode is provided and a light sensing window 24a is provided in part above the gate electrode 19a and in other regions a signal light is shielded by a light shielding film 23a.

The same advantage as that of the above embodiment is also obtained from the structure of FIG. 14, since a photo-sensor of FIG. 14 has a carrier pocket 25 within a well region 15 near the source region 16 below a gate electrode 19a.

What is claimed is:

1. A method for detecting an optical signal comprising steps of:

generating electrons and holes in a p-type well region by a signal light;

transferring the holes of said photo-generated electrons and holes to a p-type heavily doped buried layer which is buried near a n-type source region and under a channel region of an insulated gate field effect transistor formed in said p-type well region and is more heavily doped than said p-type well region, to accumulate said transferred holes in said heavily doped buried layer to thereby vary a threshold voltage of said insulated gate field effect transistor in accordance with an amount of said accumulated holes; and reading out a change in said threshold voltage as an amount of said signal light received.

2. A method for detecting an optical signal comprising steps of:

generating electrons and holes in a n-type well region by a signal light;

transferring the electrons of said photo-generated electrons and holes to a n-type heavily doped buried layer which is buried near a p-type source region and under a channel region of an insulated gate field effect transistor formed in said n-type well region and is more heavily doped than said n-type well region, to accumulate said transferred electrons in said heavily doped buried layer to thereby vary a threshold voltage of said insulated gate field effect transistor in accordance with an amount of said accumulated electrons; and reading out a change in said threshold voltage as an amount of said signal light received.

3. A method for detecting optical signals by the use of a solid-state imaging device comprising a plurality of unit pixels each including a photo-diode and an insulated gate field effect transistor, wherein each photo-diode includes:

a substrate having a p-type conductivity;

a semiconductor layer formed on said substrate and having n-type conductivity;

a well region formed on said semiconductor layer and having the p-type conductivity;

an impurity region formed on the surface of said well region and having the n-type conductivity, and wherein said insulated gate field effect transistor includes:

a drain region formed on the surface of said well region, extending to said impurity region, and having the n-type conductivity;

a source region formed on the surface of said well region, spaced apart from said drain region, and having the n-type conductivity;

a gate electrode formed on a gate insulation layer which is formed on a gate region being said well region between said drain region and said source region; and a heavily doped buried layer formed in said well region near said source region below said gate electrode, said heavily doped buried layer doped with an impurity of the p-type conductivity at a higher concentration than concentration of impurity in said well region;

and wherein said method comprises:
applying to said impurity region, said drain region, said gate electrode, and said source region a voltage which is higher than an operating voltage of said insulated gate field effect transistor in order to initialize said well region and said heavily doped buried layer, whereby holes are expelled from said well region and said heavily doped buried layer through said semiconductor substrate, and electrons are expelled from said well region through said impurity region, said drain region, and said source region, thereby depleting said well region and said heavily doped buried layer;

generating holes and electrons in said well region by illuminating said photo-diodes;

applying to said impurity region and said drain region an operating voltage, and applying to said gate electrode a voltage, such that the potential of said gate region of the insulated gate field effect transistor becomes lower than the potential of said photo-diode, thereby transferring said photo-generated holes through a bulk of said well region and accumulating them in said heavily doped buried layer;

applying to said drain region and said gate electrode an operating voltage, thereby forming an inversion region having a weak electric field along a length of a channel region between said drain region and said source region above said heavily doped buried layer charged with said photo-generated holes, and establishing a strong electric field along the length direction of said channel region except for said inversion region;

applying to said drain region and said gate electrode an operating voltage such that said insulated gate field effect transistor becomes operable under a saturated condition; and rendering said insulated gate field effect transistor to form a source follower connection, thereby, converting the change in threshold voltage of said insulated gate field effect transistor due to said photo-generated holes accumulated in said heavily doped buried layer into a change in potential of said source region of said field effect transistor, said potential of said source region representing the amount of said photo-generated charge and indicative of the detected amount of light.

4. A method for detecting optical signals by the use of a solid-state imaging device comprising a plurality of unit pixels each including a photo-diode and an insulated gate field effect transistor, wherein each photo-diode includes:

a substrate having a n-type conductivity;

a semiconductor layer formed on said substrate and having p-type conductivity;

a well region formed on said semiconductor layer and having the n-type conductivity;

an impurity region formed on the surface of said well region and having the p-type conductivity;

wherein said insulated gate field effect transistor includes:
a drain region formed on the surface of said well region, extending to said impurity region, and having the p-type conductivity;

a source region formed on the surface of said well region, spaced apart from said drain region, and having the p-type conductivity;

a gate electrode formed on a gate insulation layer which is formed on a gate region being said well region between said drain region and said source region; and a heavily doped buried layer formed in said well region near said source region below said gate electrode, said heavily doped buried layer doped with an impurity of the n-type conductivity at a higher concentration than concentration of impurity in said well region;

and wherein said method comprises:
applying to said impurity region, said drain region, said gate electrode, and said source region a voltage which is higher than an operating voltage of said field effect transistor in order to initialize said well region and said heavily doped buried layer whereby electrons are expelled from said well region and said heavily doped buried layer through said semiconductor substrate, and holes are expelled from said well region through said impurity region, said drain region, and said source region, thereby depleting said well region and said heavily doped buried layer;

generating holes and electrons in said well region by illuminating said photo-diodes;

applying to said impurity region and said drain region, said gate electrode, and said source region a negative voltage larger in magnitude than the operating voltage such that the potential of said gate region of said insulated gate field effect transistor becomes higher than the potential of said photo-diode, thereby transferring said photo-generated electrons through said well region and accumulating them in said heavily doped buried layer;

applying to said drain region and said gate electrode an operating voltage, thereby forming an inversion region having a weak electric field along a length of a channel region between said drain region and said source region above said heavily doped buried layer charged with said photo-generated electrons, and establishing a strong electric field along the length direction of said channel region except for said inversion region;

applying to said drain region and said gate electrode an operating voltage such that said insulated gate field effect transistor is operable under a saturated condition; and rendering said insulated gate field effect transistor to form a source follower connection, thereby converting a change in a threshold voltage of said insulated gate field effect transistor due to said photo-generated electrons accumulated in said heavily doped buried layer into a change in potential of said source region of said field effect transistor, said potential of said source region representing the amount of said photo-generated charges and indicative of the detected amount of light.

* * * * *

UNITED STATES PATENT AND TRADEMARK OFFICE
CERTIFICATE OF CORRECTION

PATENT NO.    : 6,512,547 B1
DATED         : January 28, 2003
INVENTOR(S)   : Miida It is certified that error appears in the above-identified patent and that said Letters Patent is hereby corrected as shown below:

Title page,
Item [56], U.S. PATENT DOCUMENTS,
"4,901,129 A    2/1990      Hynecek ......................... 257/223" should read:
-- 4,901,129 A    2/1999    Hynecek ......................... 257/223 --; and
"6,218,656 B1   4/2001      Guidash ......................... 257/299" should read:
-- 6,218,656 B1  4/2001     Guidash ......................... 257/291 --.

Column 10,
Line 66, "dear" should read -- clear --.

Column 11,
Line 15, "p+- junction" should read -- pn-junction --.

Signed and Sealed this

Nineteenth Day of August, 2003

JAMES E. ROGAN
*Director of the United States Patent and Trademark Office*